United States Patent
Denk et al.

(10) Patent No.: US 7,363,602 B2
(45) Date of Patent: Apr. 22, 2008

(54) COMPUTER-SUPPORTED, AUTOMATED METHOD FOR THE VERIFICATION OF ANALOG CIRCUITS

(75) Inventors: Georg Denk, Rosenheim (DE); Uwe Feldmann, München (DE); Lars Hedrich, Burgdorf (DE); Ralf Klausen, Wunstorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/085,595

(22) Filed: Mar. 22, 2005

(65) Prior Publication Data

US 2005/0216874 A1  Sep. 29, 2005

(30) Foreign Application Priority Data

Mar. 23, 2004  (DE) ............ 10 2004 014 178

(51) Int. Cl.
*G06F 17/50* (2006.01)
(52) U.S. Cl. ............ 716/5; 716/3; 716/4; 703/2; 703/3
(58) Field of Classification Search ............ 716/5, 716/3, 4; 703/2
See application file for complete search history.

(56) References Cited

U.S. PATENT DOCUMENTS

| | | | |
|---|---|---|---|
| 5,933,150 A * | 8/1999 | Ngo et al. ............ | 345/473 |
| 6,035,109 A * | 3/2000 | Ashar et al. ............ | 716/3 |
| 7,055,118 B1 * | 5/2006 | Kamepalli et al. ............ | 716/5 |
| 2002/0120906 A1 * | 8/2002 | Xia et al. ............ | 716/2 |
| 2002/0183990 A1 * | 12/2002 | Wasynczuk et al. ............ | 703/2 |
| 2003/0154061 A1 * | 8/2003 | Willis ............ | 703/4 |
| 2004/0044975 A1 | 3/2004 | Lai et al. ............ | 716/5 |
| 2004/0143800 A1 * | 7/2004 | Posat et al. ............ | 716/3 |
| 2005/0034090 A1 * | 2/2005 | Sato et al. ............ | 716/6 |
| 2005/0096888 A1 * | 5/2005 | Ismail ............ | 703/2 |
| 2005/0125757 A1 * | 6/2005 | Krishnamurthy ............ | 716/7 |
| 2005/0143966 A1 * | 6/2005 | McGaughy ............ | 703/3 |
| 2006/0173666 A1 * | 8/2006 | Jain et al. ............ | 703/14 |

OTHER PUBLICATIONS

Schwarz, Diana E., Consistent Initialization for Index-2 Differential Algebraic Equations and its Application to Circuit Simulation, Berlin, Jul. 2000.

* cited by examiner

*Primary Examiner*—Jack Chiang
*Assistant Examiner*—Suchin Parihar
(74) *Attorney, Agent, or Firm*—Slater & Matsil, L.L.P.

(57) ABSTRACT

The invention relates to a computer-supported, automated method for the verification of analog circuits, and to a storage medium on which a computer software program is stored for performing such method, including transforming of constants or variables characterizing a first equation system for describing the properties of a circuit; transforming of constants or variables characterizing a second equation system for describing the properties of a circuit; and performing a circuit equivalence test by using the transformed quantities obtained from transforming.

18 Claims, 2 Drawing Sheets

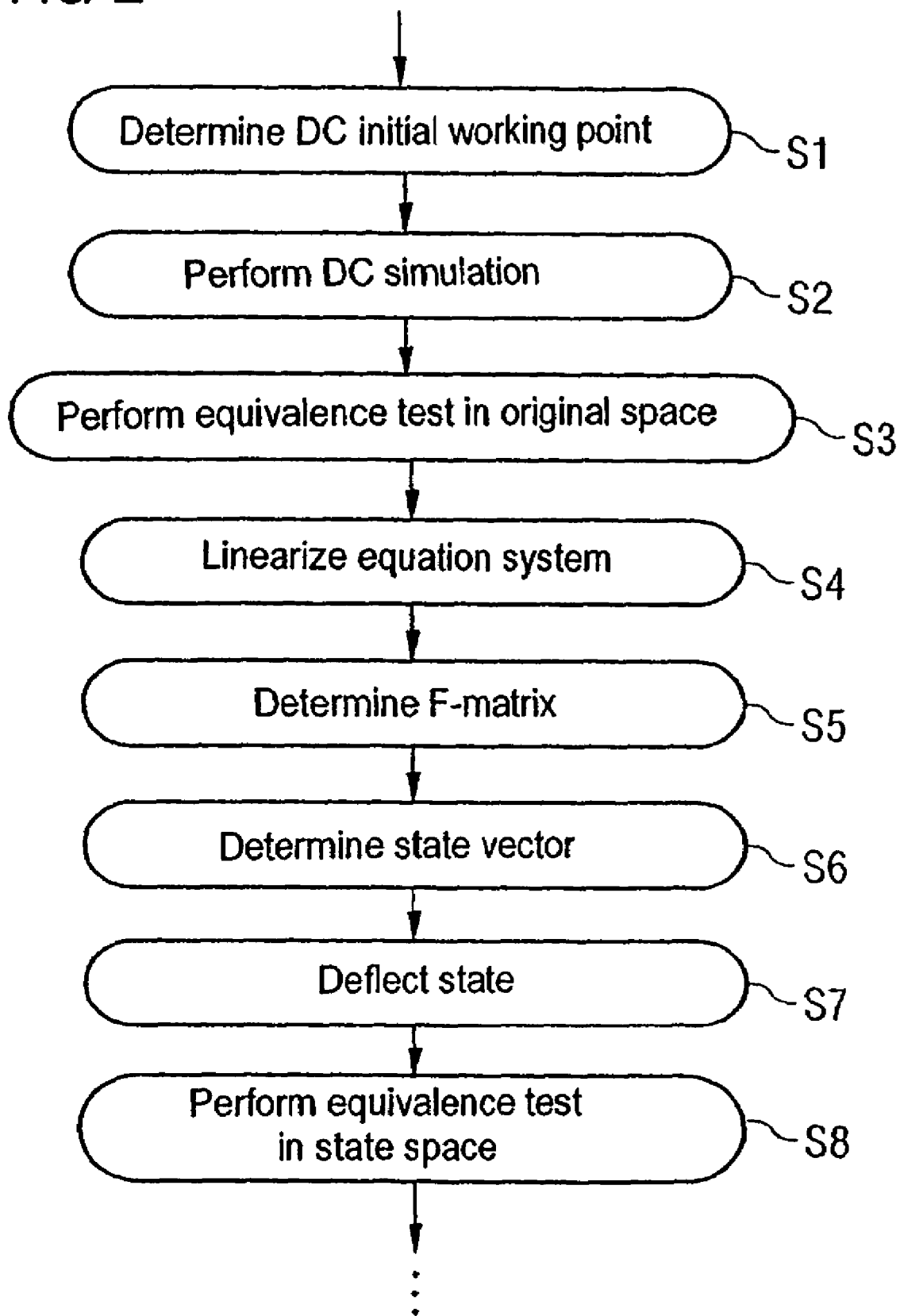

COMPUTER-SUPPORTED, AUTOMATED METHOD FOR THE VERIFICATION OF ANALOG CIRCUITS

CLAIM FOR PRIORITY

This application claims priority to German Application No. 10 2004 014 178.9 filed Mar. 23, 2004, which is incorporated herein, in its entirety, by reference.

TECHNICAL FIELD OF THE INVENTION

The invention relates to a computer-supported, automated method for the verification of analog circuits, and to a storage medium on which a computer software program for performing such method is stored.

BACKGROUND OF THE INVENTION

Due to further augmented integration densities and functionalities, the design of analog circuits has become increasingly complex.

Due to the complexity of the circuits, a structured circuit design—following, for instance, the "top-down", "bottom-up", or some other common approach—has become indispensable.

In the case of the top-down approach, the design of the corresponding circuit is, for instance, started on a relatively high abstraction level; subsequently, the corresponding design is—on ever lower abstraction levels—increasingly refined (e.g. —functionally—starting out from a "system level" to a "circuit level", etc., or—structurally—starting out from an "overall system level" via corresponding "sub-system" or "module" levels to the "individual circuit element level" with the various individual devices (transistors, diodes, resistors, capacitors, etc.).

Appropriate tests or simulations, respectively, take place (on every abstraction level) after every design step. In the case of fault, the design result will have to be modified, or the corresponding design step will have to be repeated, or the design will have to be started anew on some higher level.

The circuit models are available either e.g. structurally in the form of network lists with analog circuit elements (transistors, diodes, resistors, capacitors, etc.), or e.g. functionally in the form of an analog description language such as VHDL-AMS, or in mixed forms of structural and functional description.

The above-mentioned proceeding (performing of simulations after every design step on every abstraction level) is to ensure—despite the increased circuit complexity caused by increased integration densities and functionalities—that the designed circuit works without fault.

In the case of the common circuit simulation methods, the circuit behavior (input/output behavior)—in the time range—is examined at different test input signals, which may involve great efforts, and (since the circuit can, within a justifiable time, be tested for a limited number of different test input signals only) does not always furnish the desired certainty with respect to receiving all and any circuit states that are practically existing.

SUMMARY OF THE INVENTION

The invention to provides a novel, automated method for the verification of circuits, and a storage medium on which a computer software program for performing such method is stored.

BRIEF DESCRIPTION OF THE DRAWINGS

In the following, the invention will be explained in more detail with reference to the exemplary embodiments and drawings. The drawings show:

FIG. 2 shows the sequence of method steps performed with the present embodiment during the verification of analog circuits.

DETAILED DESCRIPTION OF THE INVENTION

The behavior of analog circuits may—in the scope of the so-called modified node analysis—be described by means of the following equation system:

$$C(x) \cdot \dot{x} + f(x,t) = 0$$

The vector x here comprises (corresponding to the "common" node analysis)—as an unknown—the node voltages searched, and (other than with the "common" node analysis)—as an additional unknown—all the currents flowing through voltage sources or coils, respectively, available in the circuit.

The concept of the modified node analysis is, for instance, described in Chung W. Ho, Albert E. Ruehli, Pierce A. Brennan, The modified nodal approach to network analysis, Proceedings of 1974 IEEE International Symposium on Circuits and Systems, April 1974, pp. 505-509.

A circuit description by means of the above-mentioned modified node analyses is not sufficient for most of the industrially relevant circuits since their behavior can only be described in compliance with reality in an enlarged charge-/flow-oriented form that takes, in particular, the charges of the capacities into additional account.

A charge-/flow-oriented form of the circuit description results in differential-algebraic equation systems of index 1 or larger, e.g. of the type:

$$A \cdot \dot{q} + f(x,t) = 0$$

$$q - f_q(x,t) = 0$$

Figure 1:
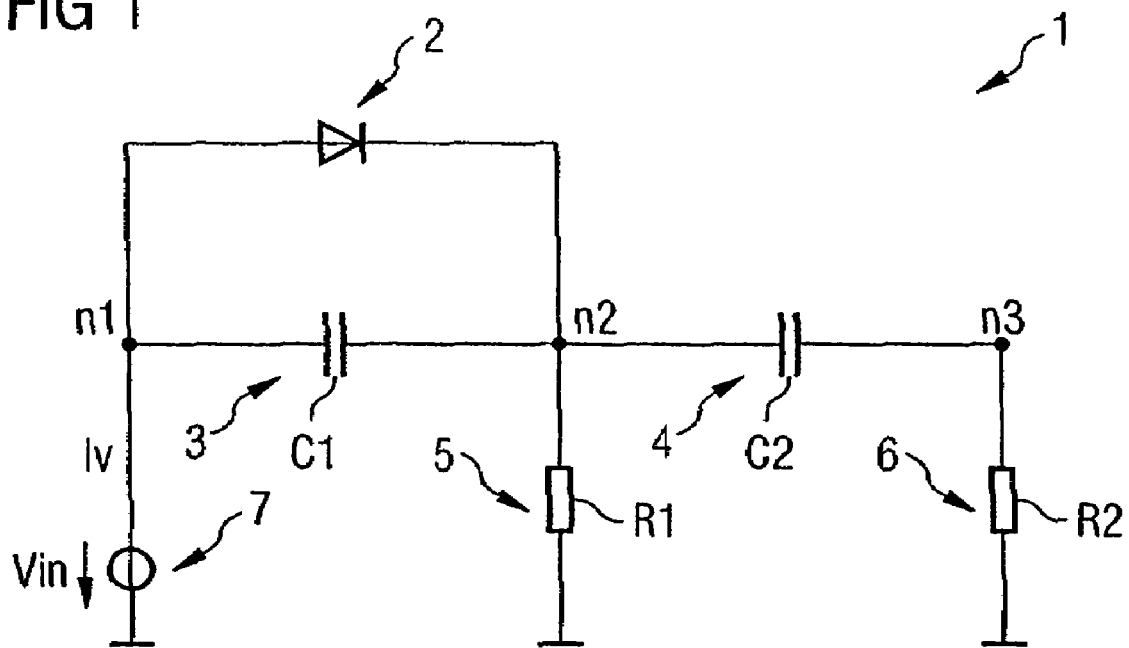
FIG. 1 shows an exemplary circuit for explaining the charge-/flow-oriented form of the circuit description used with the present embodiment.

This will be explained by way of example in more detail in the following by means of the circuit 1 illustrated in FIG. 1.

The circuit 1 comprises one diode 2, two capacitors 3, 4, two resistors 5, 6, and one voltage source 7.

The circuit 1 comprises three nodes n1, n2, n3, the potentials of which are assumed to be unknown quantities ("node voltages"). In addition there is—as additional unknown quantity—the current Iv flowing through the voltage source 7.

Furthermore, the circuit 1 comprises two state variables given by the two capacitor voltages.

For the circuit 1, the node equations and the equations for the independent currents (flowing through voltage sources) read—corresponding to the above-mentioned charge-/flow-oriented form (here: viewed—structurally—in the form of an appropriate network list description)—as follows:

$$I_V(t) + I_S(e^{(u_{nI}(t)-u_{n2}(t))/u_T} - 1) + \dot{q}_1(t) = 0$$

$$\frac{u_{n2}(t)}{R_1} - I_S(e^{(u_{nI}(t)-u_{n2}(t))/u_T} - 1) - \dot{q}_1(t) + \dot{q}_2(t) = 0$$

$$\frac{u_{n3}(t)}{R_2} - \dot{q}_2(t) = 0$$

$$u_{nI}(t) - v_{in}(t) = 0$$

$$q_1(t) = C_1 \cdot (u_{nI}(t) - u_{n2}(t))$$

$$q_2(t) = C_2 \cdot (u_{n2}(t) - u_{n3}(t))$$

The vector of the unknown quantities reads:

$$\overline{x} = \begin{bmatrix} u_{nI}(t) \\ u_{n2}(t) \\ u_{n3}(t) \\ i_v(t) \end{bmatrix} \text{ or } \overline{x} = (x, i_q)$$

The theory of the charge-/flow-oriented circuit description is described in detail, for instance, in Michael Günther, Uwe Feldmann, CAD-based electric-circuit modeling in industry, I. Mathematical structure and index of network equations, Surveys on Mathematics for Industry, 1999, vol. 8, pp. 97-129.

In the case of the present embodiment, it is verified—in a computer-supported, automated manner—whether—in the scope of respectively predetermined tolerances—two circuit descriptions assigned e.g. to two different (top-down or bottom-up, etc.) abstraction levels for one and the same circuit i) have an identical input-output behavior, and—as will be explained in more detail further below—ii) have an identical dynamic behavior (also in the scope of respectively predetermined tolerances).

One can, for instance, verify whether a corresponding structural—charge-/flow-oriented—network list description of a circuit (explained by way of example by means of the above-mentioned circuit 1) has—within corresponding tolerances—an identical dynamical behavior and an identical input-output behavior as a corresponding—e.g. functional—description of the circuit (e.g. in VHDL-AMS, etc.) (or e.g. a mixed, structural/functional circuit description, etc., etc., or a—further—structural network list description).

The equation systems to be compared $$A_1 \cdot \dot{q}_1 + f_1(x_1, t) = 0$$

$$q_1 - f_{q1}(x_1, t) = 0$$

and $$A_2 \cdot \dot{q}_2 + f_2(x_2, t) = 0$$

$$q_2 - f_{q2}(x_2, t) = 0$$

or e.g.

$$C(x) \cdot \dot{x} + f(x, t) = 0$$

in general have different dimensions.

Figure 3:
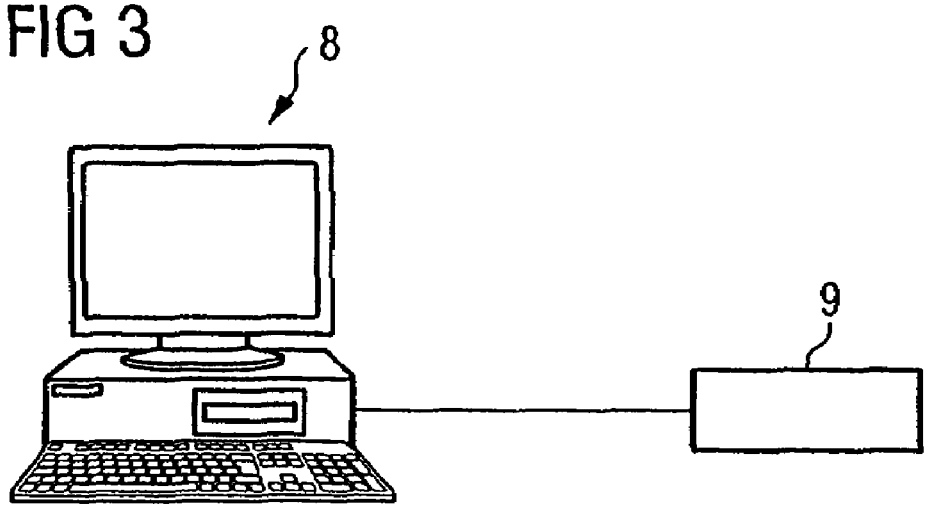
FIG. 3 shows a computer, and of a storage device connected therewith, on which computer software programs for performing the circuit verification method according to the present embodiment are stored.

The reading of the network list or of the network lists, respectively, into the computer 8—performing the verification method described here and illustrated schematically in FIG. 3—, and the drafting of the corresponding equation systems can, for instance—in an automated manner—be performed by means of an appropriate circuit simulator, e.g. Titan (circuit simulator of the Company Infineon).

To this end, a check program stored on the computer 8 sends, via the socket interface, a corresponding initialization command to Titan which will then return the list of the names of the variables and the number of the variables.

The appropriate computer software programs required for performing the circuit verification method illustrated here (check program, Titan) may be stored on a storage device 9—which is also illustrated schematically in FIG. 3—of the computer 8.

Next—for the two circuit descriptions to be compared—a balanced state is considered for a particular, predetermined (initial) input, or at a particular DC working point, respectively, e.g. at a working point characterized by $i_q = dq/dt = 0$ (cf. also step S1 illustrated in FIG. 2).

To this end, the check program sends the value of the (initial) input via a socket to Titan which performs—for the (initial) input or at an (initial) working point, respectively—a DC simulation for both circuit descriptions and returns a corresponding solution vector x that preferably contains the output directly (cf. e.g. also step S2 illustrated in FIG. 2).

The outputs resulting for the two circuit descriptions (or—more exactly—for both descriptions the quantities $x_{1,1}$ and $x_{2,1}$, as well as $x_{1,2}$ and $x_{2,2}$, etc. that correspond to one another, respectively (or y_1∈x_1, y_2∈x_2)) are compared to each other. It is in particular examined whether these are identical, or whether deviations between the resulting values of the outputs are within the above-mentioned, predetermined tolerances (i.e. a "circuit equivalence test" is performed in the original space (cf. also step S3 illustrated in FIG. 2)).

In parallel, a linearization is performed in Titan for both circuit descriptions and at the above-mentioned (initial) working point (or at the resulting quantities for the unknown $x = (x_{old}, i_{q,old})$, respectively) (cf. also step S4 illustrated in FIG. 4), wherein—as will be explained in more detail in the following—the G-, C-, and, therefrom, the F-matrices, or their inverse $F^{-1}$, respectively, are calculated (cf. also step S5 illustrated in FIG. 2).

The calculated G-, C-, F-matrices are—via the socket interface—transferred to the check program.

By means of the F-matrix (or its inverse $F^{-1}$, respectively)—as will be explained in more detail in the following—the above-mentioned circuit descriptions—in particular the vector $x = (x, i_q)$ of the unknown quantities (first of all at the initial working point $x = (x_{old}, i_{q,old})$)—are transformed from the original space to a virtual, redundancy-free, linearized subspace, e.g. by means of the image $$z = F^{-1} x$$

By that, a—transformed—state vector z is obtained; the values contained therein are—via the socket—transferred to the check program (cf. also step S6 illustrated in FIG. 2).

The F-Matrix may—as will also be explained in more detail further below—be obtained e.g. by means of a QZ method from the above-mentioned charge-/flow-oriented circuit description equations.

For the calculation of the F-Matrix—as will also be explained in more detail further below—the eigenvalues λ and the right eigenvectors Vr are required, which are determined from the generalized eigenvalue problem by means of Titan.

After the determination of the F-Matrix (and of the state vectors z) the state quantities contained in the vector z are—for the two circuit descriptions to be compared— changed in the above-mentioned virtual, redundancy-free, linearized subspace—each by a particular, fixed increment—, e.g. are increased (wherein the following applies: $\Delta z = z_{new} - z_{old}$)—in other words, the condition $z_{old}$ obtained for the system with the above-mentioned calculation is "deflected" (cf. also step S7 illustrated in FIG. 2).

To this end, the check program sends, as described above, the vector values increased by the above-mentioned increments to Titan via the socket.

Subsequently—in the above-mentioned, transformed state space—a "circuit equivalence test" is performed (cf. also step S8 illustrated in FIG. 2). To this end, it is examined whether the two circuit descriptions—in the transformed state space—have an identical dynamic behavior (or a dynamic behavior lying within the above-mentioned tolerances, respectively).

As an error measure, Titan forms—for both circuit descriptions—the respective time derivative of the above-mentioned, new ("deflected") state variables $z_{new}$ and transmits same—via the socket—to the check program.

The time derivative of the above-mentioned, new ("deflected") state variables $z_{new}$ can be determined by means of Titan by solving the following equation system:

$$C \cdot F \cdot \dot{z}_{new} = A \cdot i_{qnew}$$

C is the Jacobi matrix $$\frac{\delta f_q}{\delta x}$$

in the place $x_{old}$.

Furthermore—from the (new) state vector $z_{new}$ (or the vector $\Delta z = z_{new} - z_{old}$, respectively)—the—new—vector $x = (x_{new}, i_{q,new})$ resulting therefrom in the original space is calculated, namely (by means of Titan) by solving the equation system—resulting from the above-mentioned equation system for charge-/flow-oriented circuit descriptions:

$$A \cdot i_{qnew} + f(x_{new}) = 0$$

$$q_{new} - f_q(x_{new}) = f_q(x_{old} + F \cdot \Delta z) - f_q(x_{new}) = 0$$

Newly developed methods for calculating consistent initial values may be employed to this end, such as described, for example, in Estevez Schwarz, D.: Consistent initialization for index-2 differential algebraic equations and its application to circuit simulation, Humboldt-Univ. Berlin, PhD Thesis, 2000.

Subsequently, again and correspondingly similar as described above, a new balanced state is—for the two circuit descriptions to be compared—taken into account at a new working point, e.g. at a new working point characterized by $i_q = i_{q,new}$ (or a working point that has been changed by increments, in particular has been increased) (correspondingly similar to step S1 illustrated in FIG. 2), i.e. an appropriate DC simulation is performed.

The values determined—for the two circuit descriptions—for the outputs are again (correspondingly similar to step S3 illustrated in FIG. 2) compared to one another (there is, in particular, examined—corresponding to the explanation above—whether they are identical, or whether there exist deviations between the resulting values of the outputs within the above-mentioned, predetermined tolerances ("circuit equivalence test" in the original space)).

Furthermore—again as described above—a linearization is performed for both circuit descriptions and at the above-mentioned new working point (or at the quantities for the unknowns x resulting therefrom, respectively) (cf. also step S4 illustrated in FIG. 2) and, again—for the new working point—the G-, C-, and therefrom—as explained above—die F- or $F^{-1}$-matrices are calculated (cf. also step S5 illustrated in FIG. 2).

By means of the F- (or $F^{-1}$-) matrix—corresponding to step S6 illustrated in FIG. 2 and as described above—a transformation of the vector x is performed from the original space to a virtual, redundancy-free, canonical or linearized subspace and—again—a corresponding, transformed state vector z is determined.

Subsequently, the state quantities contained in the vector z are again changed—each again by the above-mentioned particular, fixed increment (corresponding to step S7 illustrated in FIG. 2), and then a "circuit equivalence test" is again performed in the above-mentioned, transformed state space, corresponding to the explanations above (cf. also step S8 illustrated in FIG. 2).

The above-mentioned steps S1 to S8—illustrated schematically in FIG. 2—are repeated for all the working points predetermined by the check program (each determined and run through step by step in accordance with the description above).

If it is determined in all the tests performed in the original and in the transformed state space (steps S3 or S8, respectively) that the corresponding quantities lie within the above-mentioned tolerance ranges, the two circuit descriptions are considered to be "equivalent" or sufficiently equivalent, respectively. If this is not the case, the computer 8 may—controlled by the check program—e.g. output an appropriate error message.

The following is a brief explanation about how the matrices required for the above-mentioned verification method (in particular the G-, C-, and F-matrices) can be calculated.

Starting point for the considerations is the generalized eigenvalue problem:

$$(C\alpha + G\beta)x = 0$$

with the eigenvalues $\lambda = \alpha/\beta$.

The matrices G and C correspond to the leading value and capacity matrix of the respective linearized system.

For solving the above-mentioned generalized eigenvalue problem, e.g. the QZ algorithm that has already been mentioned above may be employed.

For the further calculation, the following assumptions are made:

Assumption 1: G is regular, invertible all eigenvalues $\lambda$ are $\neq 0$;

Assumption 2: The number of the eigenvectors corresponds to the number of the eigenvalues the algebraic and geometric multiplicity are identical;

index $\leq 1$;

no secondary diagonal elements in G and C;

Assumption 3: E and F are invertible.

Searched are the two transformation matrices E and F, for which the following shall apply:

$$EGF = \overline{G} = \begin{bmatrix} -\lambda 1 & 0 & \cdots & 0 \\ 0 & -\lambda 2 & & \vdots \\ \vdots & & \ddots & 0 \\ 0 & \cdots & \cdots & -\lambda n \end{bmatrix} \text{ and}$$

$$ECF = \overline{C} = \begin{bmatrix} 1 & 0 & \cdots & 0 \\ 0 & 1 & & \vdots \\ \vdots & & \ddots & 0 \\ 0 & \cdots & \cdots & 0 \end{bmatrix}$$

The QZ algorithm returns the right eigenvectors in matrix form. The right eigenvectors are deposited in the corresponding matrix column by column:

$V_r = [v_r(\lambda 1)|v_r(\lambda 2)| \ldots |v_r(\lambda n)]$

Taking into account this equation, the solution of the generalized eigenvalue problems can be represented as follows:

$CV_r\overline{G} - GV_r\overline{C} = 0$

Furthermore, there follows from the above-mentioned equations by multiplication with $E^{-1}$ from the left:

$GF = E^{-1}\overline{G}$ and $CF = E^{-1}\overline{C}$

The transformation matrices E and F can be determined by means of coefficient comparison. To this end, the negative summand of the above-mentioned equation $CV_r\overline{G} - GV_r\overline{C} = 0$ is taken to the right side and this equation is compared to the above-mentioned equations $GF = E^{-1}\overline{G}$ or $CF = E^{-1}\overline{C}$, respectively.

As a result, one obtains:

$F = V_r\overline{C}$ $E^{-1} = CV_r$ $F = V_r\overline{G}$ $E^{-1} = GV_r$

The above-mentioned equation $F = V_r\overline{C}$ appears to be not suited for the determination of E and F since the term $\overline{C}$ has Zeros in the lower portion and thus leads to trivial solutions.

This is not the case with the equations $F = V_r\overline{G}$ or $E^{-1} = GV_r$, respectively.

Since the matrices G and $V_r$ have full rank, they can be inverted and dissolved to:

$F = V_r\overline{G}$ $E = V_r^{-1}G^{-1}$

Since both $\overline{G}$ and $\overline{C}$ are diagonal matrices, $\overline{G}$ can be shifted by a multiplication with $\overline{G}^{-1}$ being performed from the right prior to the above-mentioned coefficient comparison. Then, the following equations result:

$F = Vr$ $E = \overline{G}V_r^{-1}G^{-1}$

For systems with an index >1, a correspondingly enlarged approach can be used.

For the above-mentioned exemplary circuit 1 illustrated in FIG. 1, the C- and G-matrices correspondingly are calculated as follows:

$$\underline{G} = \begin{bmatrix} \frac{I_S}{u_t}\left(e^{(u_{n1,AP}-u_{n2,AP})/u_T}\right) & -\frac{I_S}{u_t}\left(e^{(u_{n1,AP}-u_{n2,AP})/u_T}\right) & 0 & 1 \\ -\frac{I_S}{u_t}\left(e^{(u_{n1,AP}-u_{n2,AP})/u_T}\right) & \frac{1}{R_1} + \frac{I_S}{u_t}\left(e^{(u_{n1,AP}-u_{n2,AP})/u_T}\right) & 0 & 0 \\ 0 & 0 & \frac{1}{R_2} & 0 \\ 1 & 0 & 0 & 0 \end{bmatrix}$$

$$\underline{C} = \begin{bmatrix} C_1 & -C_1 & 0 & 0 \\ -C_1 & C_1 + C_2 & -C_2 & 0 \\ 0 & -C_2 & C_2 & 0 \\ 0 & 0 & 0 & 0 \end{bmatrix}$$

The finite eigenvalues of the circuit 1 are symbolically for R1=R2 and C1=C2:

$$\lambda_1 = \frac{-3 - G_1R_1 + \sqrt{5 + 2G_1R_1 + G_1^2R_1^2}}{2C_1R_1}$$

$$\lambda_2 = \frac{-3 - G_1R_1 + \sqrt{5 + 2G_1R_1 + G_1^2R_1^2}}{2C_1R_1} \text{ with}$$

$$G_1 = \frac{I_S}{u_t}\left(e^{(u_{n1,AP}-u_{n2,AP})/u_T}\right)$$

Additionally, there are two infinite eigenvalues. The matrix of the right eigenvectors is calculated for equal Rs and Cs symbolically as follows:

$$\underline{V}_r = \begin{bmatrix} 0 & 0 & -1 & 0 \\ \frac{R_1\left(G_1R_1 - 3 - \sqrt{5 + 2G_1R_1 + G_1^2R_1^2}\right)}{-2 + 4G_1R_1} & \frac{R_1\left(G_1R_1 - 3 + \sqrt{5 + 2G_1R_1 + G_1^2R_1^2}\right)}{-2 + 4G_1R_1} & -1 & 0 \\ \frac{R_1\left(3G_1R_1 + 1 + \sqrt{5 + 2G_1R_1 + G_1^2R_1^2}\right)}{-2 + 4G_1R_1} & \frac{R_1\left(3G_1R_1 + 1 - \sqrt{5 + 2G_1R_1 + G_1^2R_1^2}\right)}{-2 + 4G_1R_1} & -1 & 0 \\ -1 & -1 & -2 & -2 \end{bmatrix}$$

The invention claimed is:

1. A computer-supported, automated method for the verification of analog circuits, the method comprising:
transforming constants or variables of a first equation system to a linear state space, wherein the first equation system describes a circuit at a first level of abstraction;

transforming constants or variables of a second equation system to a linear state space, wherein the second equation system describes the circuit at a second level of abstraction; and performing an equation system equivalence test by using transformed quantities obtained from the transforming.

2. The method according to claim 1, wherein said first equation system for describing the properties of the circuit is based on a charge-/flow-oriented form of the circuit description.

3. The method according to claim 1, wherein said second equation system for describing the properties of the circuit is based on a charge-/flow-oriented form of the circuit description.

4. The method according to claim 1, wherein said first equation system is of index >0.

5. The method according to claim 1, wherein said second equation system is of index >0.

6. The method according to claim 1, wherein said first and second equation systems are of different dimensions.

7. The method according to claim 1, wherein said constants or variables are transformed to a canonical state space.

8. The method according to claim 1, wherein, for performing the equation system equivalence test, it is examined whether an identical or a merely slightly deviating dynamic behavior, in particular a canonical state space, is given for both circuit descriptions.

9. The method according to claim 1, wherein, for performing the equation system equivalence test, it is examined whether an identical or a merely slightly deviating input-output behavior, in particular an original space, is given for both circuit descriptions.

10. A storage medium on which a computer software program is stored, the computer executing the following:
transforming constants or variables of a first equation system to a linear state space, wherein the first equation system describes a circuit at a first level of abstraction;
transforming constants or variables of a second equation system to a linear state space, wherein the second equation system describes the circuit at a second level of abstraction; and
performing an equation system equivalence test by using transformed quantities obtained from the transforming.

11. The storage medium according to claim 10, wherein:
the first level of abstraction comprises a functional description of the circuit; and
the second level of abstraction comprises a circuit element level description of the circuit.

12. The method according to claim 11, wherein:
the first level of abstraction comprises a functional description of the circuit; and
the second level of abstraction comprises a circuit element level description of the circuit.

13. A software program for verifying a circuit, the software program executing steps comprising:
transforming constants or variables of a first equation system to a linear state space, wherein the first equation system describes a circuit at a first level of abstraction;
transforming constants or variables of a second equation system to a linear state space, wherein the second equation system describes the circuit at a second level of abstraction; and
performing an equation system equivalence test by using transformed quantities obtained from the transforming.

14. The software program according to claim 13, wherein:
the first level of abstraction comprises a functional description of the circuit; and
the second level of abstraction comprises a circuit element level description of the circuit.

15. The software program according to claim 13, wherein said first equation system for describing the properties of the circuit is based on a charge-/flow-oriented form of the circuit description.

16. The software program according to claim 13, wherein said constants or variables are transformed to a canonical state space.

17. The software program according to claim 13, wherein, for performing the equation system equivalence test, it is examined whether an identical or a merely slightly deviating dynamic behavior, in particular a canonical state space, is given for both circuit descriptions.

18. The software program according to claim 13, wherein, for performing the equation system equivalence test, it is examined whether an identical or a merely slightly deviating input-output behavior, in particular an original space, is given for both circuit descriptions.

* * * * *